US006754129B2

(12) United States Patent
Khatri et al.

(10) Patent No.: US 6,754,129 B2
(45) Date of Patent: Jun. 22, 2004

(54) MEMORY MODULE WITH INTEGRATED BUS TERMINATION

(75) Inventors: Dirgha Khatri, Boise, ID (US); Dail Robert Cox, Meridian, ID (US); Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 10/056,193

(22) Filed: Jan. 24, 2002

(65) Prior Publication Data

US 2003/0137860 A1 Jul. 24, 2003

(51) Int. Cl.[7] .............................................. G11C 11/00
(52) U.S. Cl. ................. 365/226; 365/189.03; 365/191; 365/206
(58) Field of Search ............................ 365/226, 189.03, 365/191, 206

(56) References Cited

U.S. PATENT DOCUMENTS

| | | | | |
|---|---|---|---|---|
| 5,955,889 A | * | 9/1999 | Taguchi | |
| 6,067,594 A | * | 5/2000 | Perino | |
| 6,256,235 B1 | * | 7/2001 | Lee | |
| 6,266,252 B1 | * | 7/2001 | Karabatsos | |
| 6,510,100 B2 | * | 1/2003 | Grundon | |

FOREIGN PATENT DOCUMENTS

JP  407261892 A  * 10/1995  ............. G06F/3/00

* cited by examiner

*Primary Examiner*—Viet Q. Nguyen
(74) *Attorney, Agent, or Firm*—Williams, Morgan & Amerson, P.C.

(57) ABSTRACT

A memory module includes a memory device, a connector, a plurality of lines coupling the memory device and the connector, and termination circuitry coupled to at least a subset of the lines. A method for terminating a memory bus includes providing at least two expansion sockets coupled to the memory bus; interfacing two expansion memory modules including termination circuitry with the expansion sockets; and disabling the termination circuitry for one of the expansion memory modules.

44 Claims, 6 Drawing Sheets

MEMORY MODULE WITH INTEGRATED BUS TERMINATION

BACKGROUND OF THE INVENTION

1. Field of the Invention

This invention relates generally to the field of memory devices and, more particularly, to a memory module with integrated bus termination.

2. Description of the Related Art

Typical computer systems generally include a processing unit, such as a microprocessor, dynamic memory resources, data storage resources, and other peripheral resources, such as I/O resources. A circuit board is provided for interconnecting these various resources. Some of the resources are installed directly on the circuit board, while other resources connect to the circuit board through expansion sockets. For instance, a particular circuit board may have surface-mounted memory modules, memory modules that interface through one or more expansion sockets, or a combination of both.

Commonly used memory modules that interface through expansion sockets through edge connectors are multi-chip modules (MCMs). Generally, MCMs may be designed to include more than one type of die within a single package, or may include multiples of the same die, such as a single inline memory module (SIMM) or a dual in-line memory module (DIMM). MCMs are available in different capacities and speeds to accommodate the needs of the computer system.

The memory resources, whether installed directly on the circuit board or through expansion sockets, are coupled to a common memory bus, where data, address, and command signals are provided in parallel to the various modules. The memory bus thus includes a plurality of transmission lines. The operating environment (e.g., speed, bus load) and physical characteristics (e.g., length) of the memory bus affect the characteristics of the transmission lines. Signals traveling along the transmission lines may be reflected at the ends of the bus, thus interfering with the signals. In general, as the speed of the memory bus increases or the load on the memory bus increases the sensitivity of the bus to the reflections also increases.

One technique for reducing the effects of reflections on the memory bus is to terminate the transmission lines of the bus. Although various termination schemes may be employed, a common termination scheme is to use a pull-up resistor coupled to a voltage source, $V_{tt}$, that is typically half the voltage corresponding to a logic one on the bus. For example, if a logic one is represented by a voltage of 1.8 V, the termination voltage, $V_{tt}$, may be 0.9 V. One limitation of the bus termination technique is the relatively large surface area of the circuit board that is consumed by the termination circuitry. The termination circuitry increases the cost of the circuit board and also reduces the area available for other resources.

Depending on the particular resources installed on the circuit board, the termination may or may not be necessary. For example, if only on-board memory is used, the load on the bus may be sufficiently small that the reflections do not significantly affect the operation of the bus. In such an installation, the termination circuitry represents an unnecessary expenditure of resources. In other installations, where one or more memory modules are provided in expansion sockets, the termination circuitry may be required.

Typically, the central circuit boards, otherwise referred to as motherboards, and the memory modules are provided by different manufacturers. Dependence on termination circuitry provided by the circuit board manufacturer limits the flexibility of the memory module manufacturer, in that its memory modules may only be used in selected systems.

The present invention is directed to overcoming, or at least reducing the effects of, one or more of the problems set forth above.

SUMMARY OF THE INVENTION

One aspect of the present invention is seen in a memory module including a memory device, a connector, a plurality of lines coupling the memory device and the connector, and termination circuitry coupled to at least a subset of the lines.

Another aspect of the present invention is seen in a method for terminating a memory bus. The method includes providing at least two expansion sockets coupled to the memory bus; interfacing two expansion memory modules including termination circuitry with the expansion sockets; and disabling the termination circuitry for one of the expansion memory modules.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
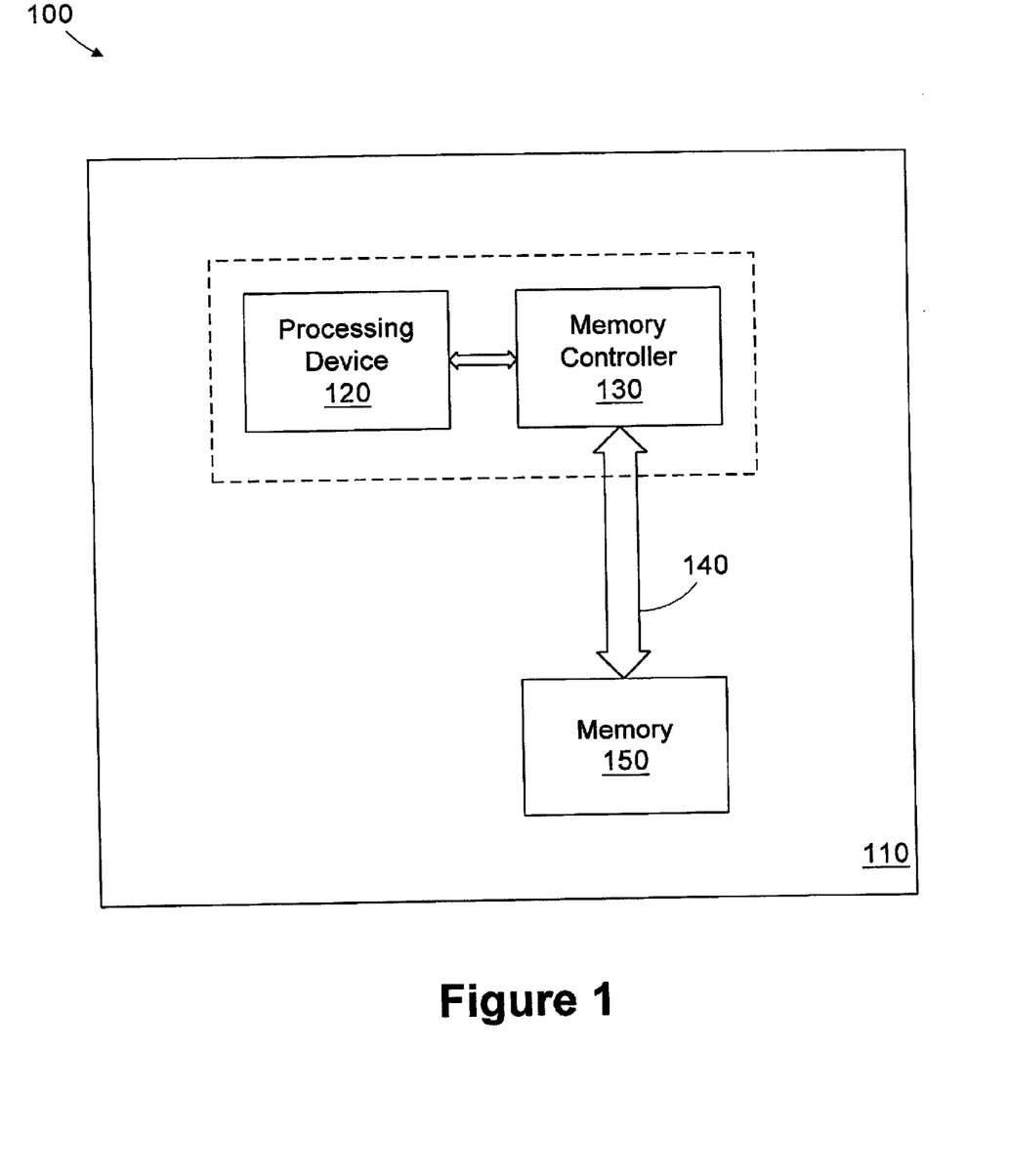
FIG. 1 is a simplified block diagram of a computing system in accordance with one illustrative embodiment of the present invention.

Referring to FIG. 1, a simplified block diagram of a computing system 100 in accordance with one embodiment of the present invention is provided. FIG. 1 illustrates a computing system 100 including a circuit board 110 on which a processing device 120 (e.g., a general purpose microprocessor, a digital signal processor, or the like), a memory controller 130, a memory bus 140, and memory 150 are installed. In some embodiments, the processing device 120 and memory controller 130 may be integrated into a single device, as represented by the dashed lines surrounding both. The memory 150 may include a variety of memory types, including synchronous dynamic random access memory (SDRAM), double data rate dynamic random access memory (DDR SDRAM), synchronous random access memory (SRAM), synchronous graphics random access memory (SGRAM), etc. As will be appreciated by those of ordinary skill in the art, other devices that are not shown, such as a video controller, input/output (I/O) controller, etc., may also be installed on the circuit board 110, depending on the particular implementation. The circuit board 110 may be used in a variety of applications, such as a desktop or notebook computing system, a peripheral device (e.g., printer), or a specialized device or controller.

Figure 2:
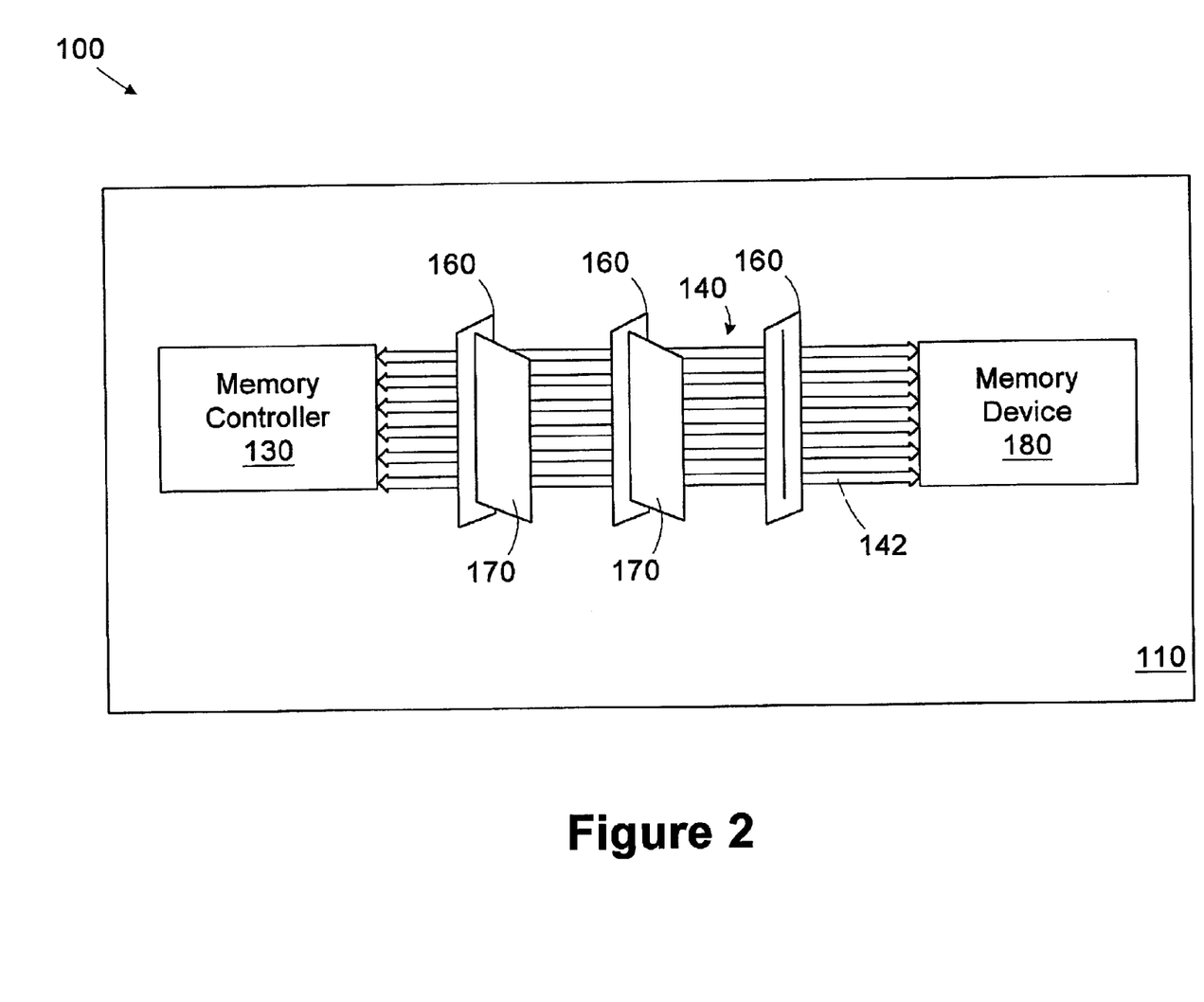
FIG. 2 is a simplified diagram of a portion of the computing system of FIG. 1 showing a memory bus with expansion memory sockets.

FIG. 2 represents a simplified diagram of a portion of the circuit board 110 illustrating the memory controller 130 and the memory bus 140. The memory bus 140 includes a plurality of lines 142, including clock lines, data lines, address/command lines, strobe lines, etc. In an actual implementation many more lines 142 than are shown in FIG. 2 make up the memory bus 140, but to simplify the drawings and to avoid unnecessarily obfuscating the invention, the memory bus 140 is stylistically represented by a relatively few representative lines.

Expansion memory sockets 160 are coupled to the memory bus 140. Although the illustrative embodiment shows three expansion memory sockets 160, any number from 1 to N may be used. The memory 150 shown in FIG. 1 may be implemented using expansion memory modules 170, such as SIMM, DIMM, microDIMM, small outline DIMM modules, etc., interfaced with the memory expansion sockets 160. In some embodiments, not all of the expansion memory sockets 160 may be populated with expansion memory modules 170. For example, in the illustrated embodiment of FIG. 2, one of the expansion memory sockets 160 does not have an expansion memory module 170 installed therein. The memory 150 may also include one or more memory devices 180 directly coupled to the circuit board 110. In some embodiments, no directly-coupled memory devices 180 are provided, and the memory 150 includes only the expansion memory modules 170. As will be described in greater detail below, the expansion memory modules 170 include termination circuitry for terminating the lines 142 of the memory bus 140.

Figure 3:
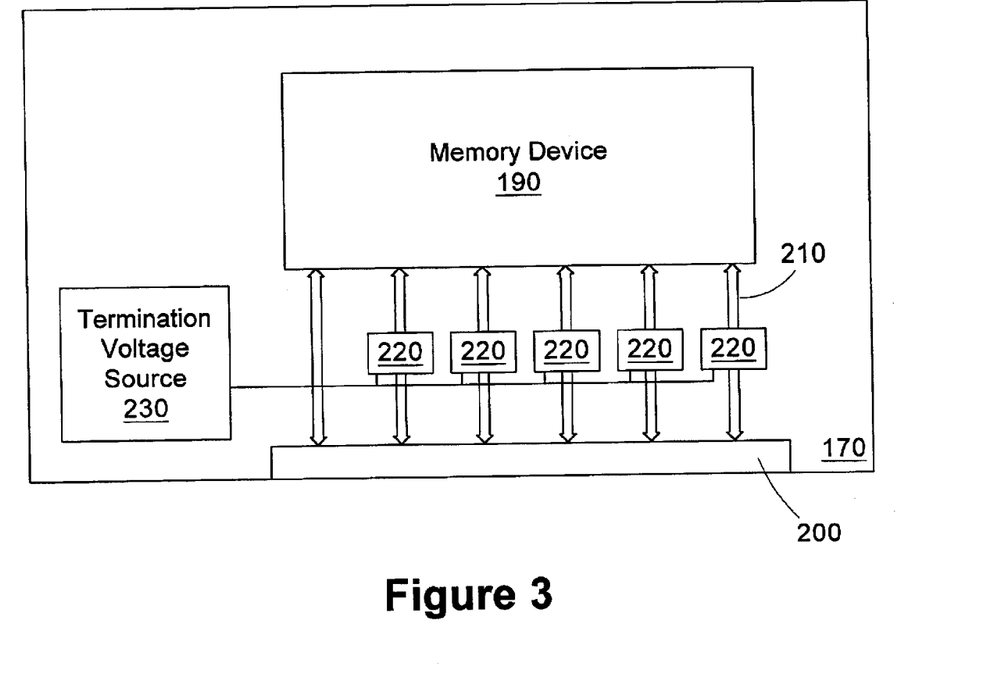
FIG. 3 is a simplified block diagram of a first exemplary embodiment of a memory module that may be used in the system of FIGS. 1 and 2.

Turning now to FIG. 3, a simplified diagram of an exemplary embodiment of the expansion memory module 170 is provided. The expansion memory module 170 includes a memory device 190 coupled to an edge connector 200 through lines or traces 210. In a DIMM arrangement, another memory device and its associated lines (not visible) are present on the back side (not visible) of the expansion memory module 170. The lines 210 correspond to the lines 142 of the memory bus 140. The edge connector 200 interfaces with the expansion memory socket 160 thus connecting the memory device 190 to the memory bus 140. Termination devices 220 are provided on at least a portion of the lines 210 for terminating the memory bus 140 to reduce the effects of reflections at the ends of the memory bus 140. Not all of the lines 142 on the memory bus 140 may require termination. For example, a differential clock signal may be provided on the memory bus 140. Due to its differential nature, the same type of termination voltage is not necessary, as a termination resistor coupling the lines in the differential pair is normally provided. In the embodiment of FIG. 3, the expansion memory module 170 also includes a termination voltage source 230 for providing a termination voltage signal, $V_{tt}$, to the termination devices 220. In the illustrated embodiment the termination voltage is about half the supply voltage, $V_{dd}$, provided to the expansion memory module 170.

Figure 4:
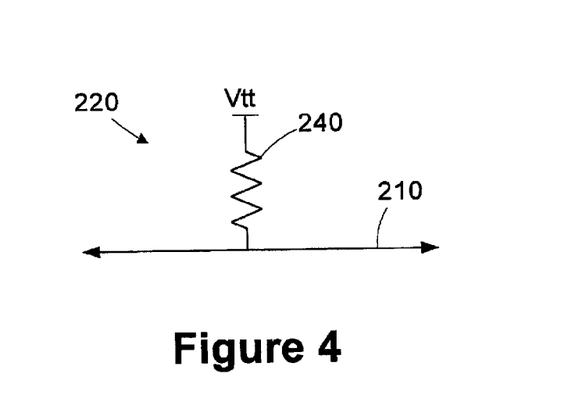
FIG. 4 is a simplified diagram of an exemplary termination device.

Referring briefly to FIG. 4, an exemplary embodiment of one of the termination devices 220 is provided. The termination device 220 includes a pull-up resistor 240 coupled between the line 210 and $V_{tt}$. Although the termination device 220 is illustrated as a pull-up resistor 240, it will be appreciated by those of ordinary skill in the art that other termination devices may also be used. The termination device 220 may be constructed using any known electrical termination devices, including but not limited to diodes, capacitors, inductors, resistors, and combinations of these devices. For simplicity, however, the termination circuitry is illustrated generally as resistors.

Figure 5A:
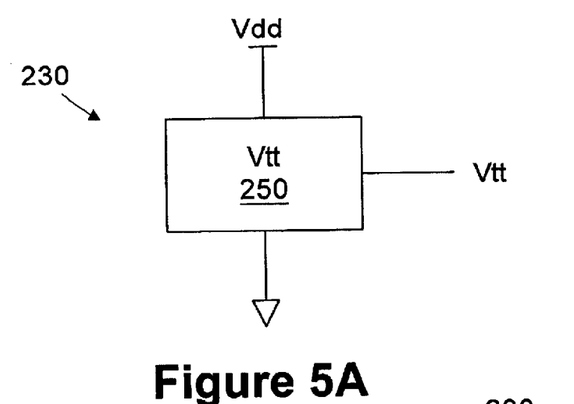
FIGS. 5A through 5C are diagrams of alternate circuits for providing a termination voltage for termination devices.
Figure 5B:
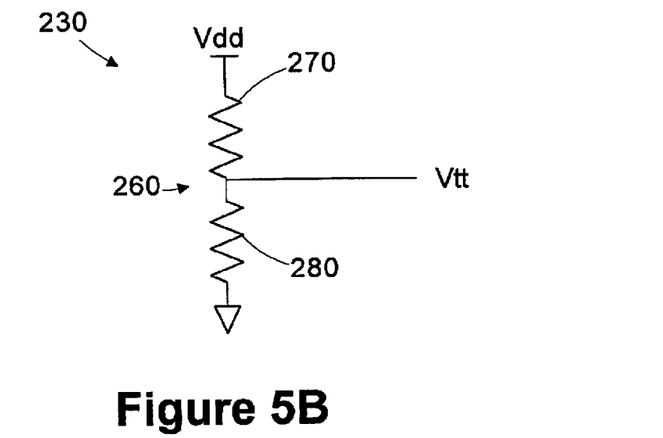
Figure 5C:
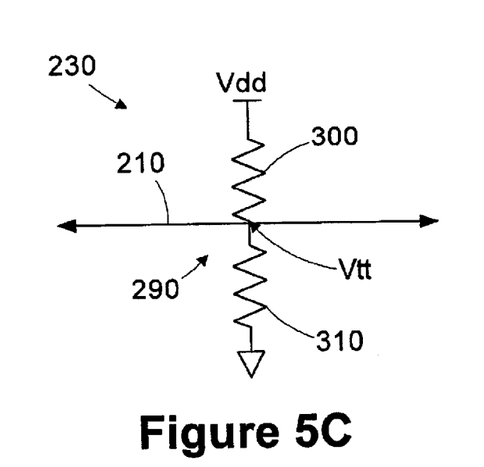

Turning now to FIGS. 5A, 5B, and 5C, exemplary embodiments of the termination voltage source 230 are provided. In the embodiment of FIG. 5A, the termination voltage source 230 is a voltage regulator 250 configured to receive a supply voltage, $V_{dd}$, and provide a regulated output voltage of $V_{tt}$. Specific voltage regulation devices and circuit constructions for implementing the voltage regulator 250 are well known to those of ordinary skill in the art, and thus are not discussed in greater detail herein for clarity and to avoid obscuring the instant invention.

In the exemplary embodiment of FIG. 5B, the termination voltage source 230 is implemented using a voltage divider 260 including a first resistor 270 coupled to the supply voltage, $V_{dd}$, and a second resistor 280 coupled between the first resistor 270 and ground. Assuming the supply voltage, $V_{dd}$, is twice the desired termination voltage, $V_{tt}$, the first and second resistors 270, 280 would have substantially equal resistance values. The termination voltage, $V_{tt}$, is generated between the first and second resistors 270, 280.

In the exemplary embodiment of FIG. 5C, the termination device 220 and the termination voltage source 230 are provided using separate voltage dividers 290 for each line 210 on which termination is required. The voltage dividers 290 are similar to the voltage divider 280 of FIG. 5B, except that they may be implemented using resistors 300, 310 having smaller current carrying capacity than the resistors 270, 280, because each voltage divider 290 provides the termination voltage for only one of the lines 210.

Figure 6:
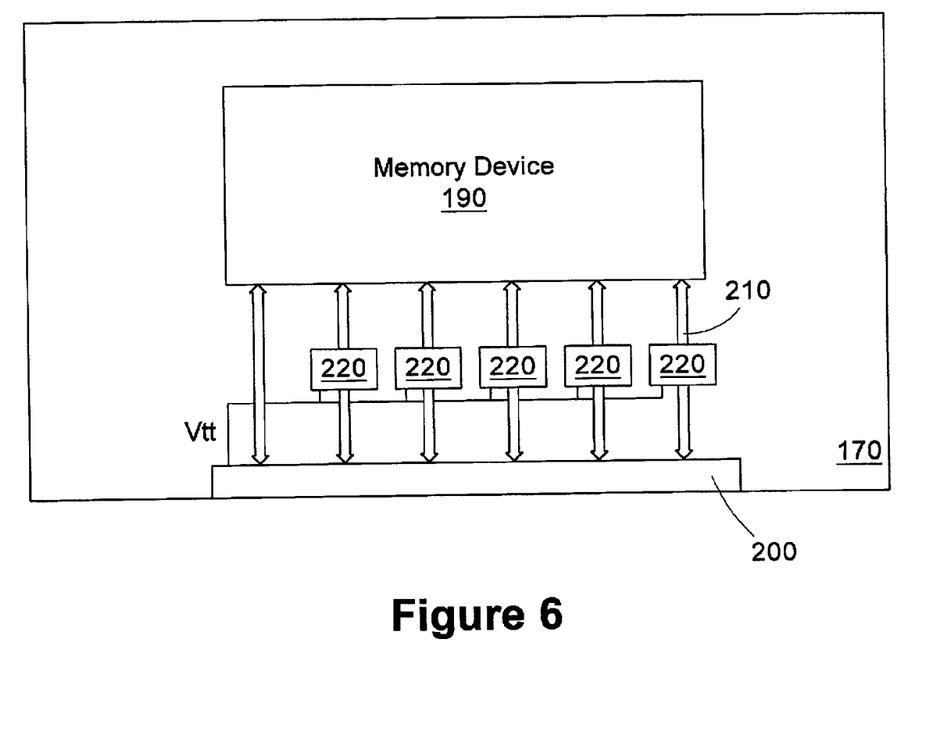
FIGS. 6 and 7 are a simplified block diagrams of second and third exemplary embodiments of memory modules that may be used in the system of FIGS. 1 and 2.

Referring to FIG. 6, a diagram of an alternative embodiment of the expansion memory module 170 is provided. In the embodiment of FIG. 6, the termination voltage is not generated on the expansion memory module 170, but rather the termination voltage is supplied by the circuit board 110 through the edge connector 200.

Figure 7:
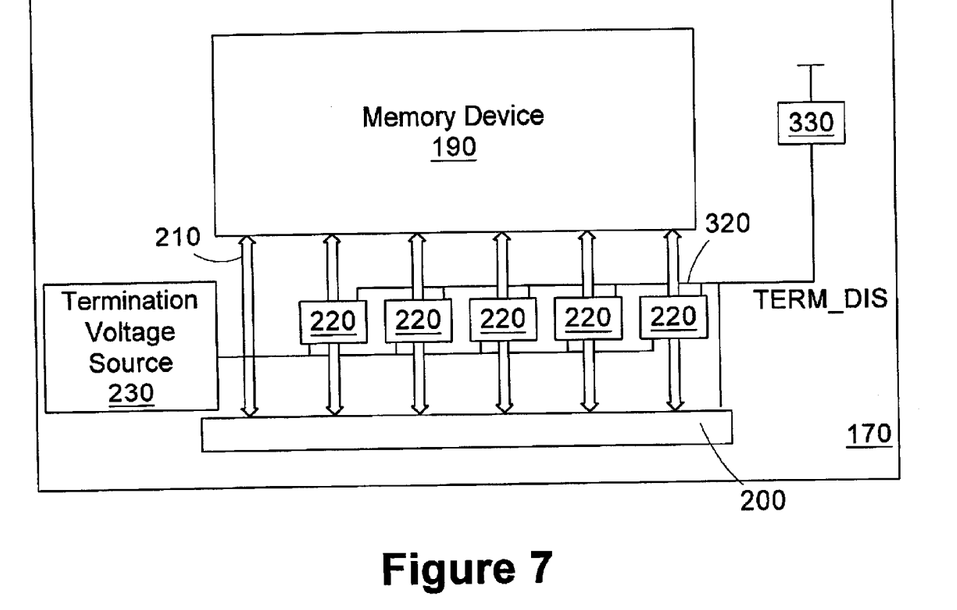

FIG. 7 illustrates yet another embodiment of the expansion memory module 170 wherein the termination devices 220 may be selectively enabled or disabled based on a termination disable signal (TERM_DIS#) present on a termination disable line 320. In response to the TERM_DIS# signal being in the state corresponding to a disable condition, the termination devices 200 are isolated from the lines 210, thereby inhibiting the termination function. If the TERM_DIS# signal is in the state corresponding to an enable condition, the termination devices 200 are enabled and they terminate the lines 210. The TERM_DIS# signal may be provided by the circuit board 110 through the edge connector 200 in one embodiment, while in another embodiment, a switch 330 (e.g., mechanical switch or jumper) on the expansion memory module 170 may be configured to enable or disable the termination function. Although FIG. 7 shows both the switch 330 and the connection between the termination disable line 320 and the edge connector 200, typically only one may be provided.

Figure 8:
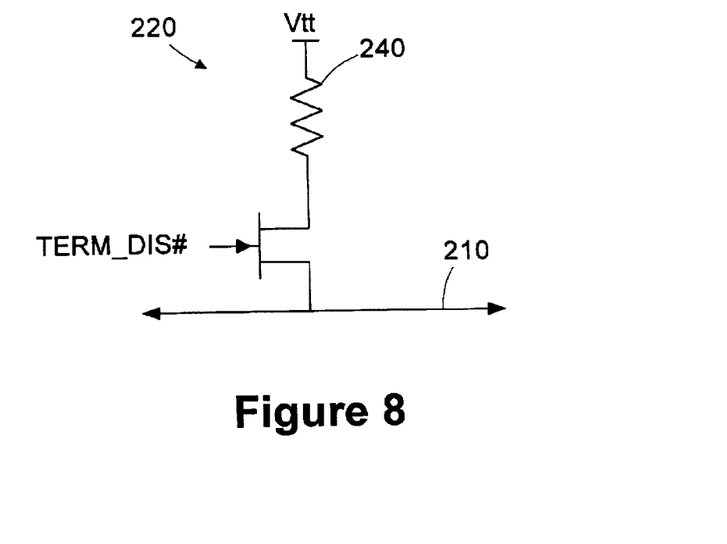
FIG. 8 is a simplified diagram of an exemplary termination device including disabling circuitry that may be used in the memory module of FIG. 7.

Referring briefly to FIG. 8, a simplified diagram of an exemplary termination device 220 including a switching device 340, such as an enable transistor, for disabling the termination function is provided. The switching device 340, when disabled, isolates the pull-up resistor 240 from the line 210. In an alternative embodiment, the termination devices 220 may include switchable resistors (not shown) capable of being isolated, or alternatively, switching devices, such as transistors, may be used in conjunction with the resistors to isolate them from the lines 210.

Termination enabling may be used in the case where multiple expansion memory modules 170 are installed into the expansion memory sockets 160. It may be desirable to terminate only one end of the memory bus 140. Accordingly, only the last expansion memory module 170 on the memory bus 140 may have its termination devices 220 enabled, and the other expansion memory modules 170 may have their termination devices 220 disabled. Although the embodiment of FIG. 7 shows the termination voltage source 230 on the expansion memory module 170, the termination enable capability may also be implemented with the configuration of FIG. 6, whereby the termination voltage, $V_{tt}$, is supplied through the edge connector 200.

Locating the termination circuitry for the memory bus 140 and/or the termination voltage generation circuitry on the expansion memory module 170 has numerous advantages. The cost of the circuit board 110 may be reduced, or additional circuitry may be provided from the recovered surface area. The flexibility of the expansion memory module 170 is also increased as it may be installed in a wider variety of applications (i.e., circuit boards 100 with or without bus termination circuitry). The expansion memory module 170 may be installed in circuit boards 110 that would not otherwise provide sufficient bus termination. For example, a circuit board 110 may be provided with on-board memory and a memory expansion slot. If just the on-board memory were to be installed, termination may not be required. However, if an expansion memory module is added (e.g., the expansion memory module 170), the memory bus may require termination. Having the termination circuitry available on the expansion memory module 170 allows the manufacturer of the circuit board 110 to avoid installing unnecessary termination circuitry for those installations that do not require termination, while still providing the flexibility to expand the memory capacity if desired. Providing circuitry for selectively enabling or disabling the termination circuitry on the expansion memory module 170 further increases its flexibility.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory module, comprising:
   a memory device;
   a connector;
   a plurality of lines coupling the memory device and the connector;
   termination circuitry coupled to at least a subset of the lines; and
   a termination voltage generator adapted to generate a termination voltage signal, the termination circuitry being configured to terminate the subset of the lines using the termination voltage signal.

2. The memory module of claim 1, wherein the termination circuitry further comprises a pull-up resistor coupled between each of the lines in the subset and the termination voltage generator.

3. The memory module of claim 1, wherein the termination voltage generator further comprises a voltage regulator.

4. The memory module of claim 1, wherein the termination voltage generator further comprises a voltage divider.

5. The memory module of claim 4, wherein the voltage divider further comprises:
   a first resistor having a first terminal coupled to a supply voltage source and a second terminal coupled to one of the lines in the subset; and
   a second resistor having a first terminal coupled to the second terminal of the first resistor and a second terminal coupled to ground, the termination voltage signal being generated at the connection of the second terminal of the first resistor and the first terminal of the second resistor.

6. A memory module, comprising:
   a memory device;
   a connector;
   a plurality of lines coupling the memory device and the connector; and
   termination circuitry coupled to at least a subset of the lines including, a plurality of voltage dividers coupled to the lines in the subset, each voltage divider comprising:
   a first resistor having a first terminal coupled to a supply voltage source and a second terminal coupled to one of the lines in the subset; and
   a second resistor having a first terminal coupled to the second terminal of the first resistor and a second terminal coupled to ground, the termination voltage being generated at the connection of the second terminal of the first resistor and the first terminal of the second resistor.

7. The memory module of claim 1, further comprising enable circuitry coupled to the termination circuitry and being configured to disable the termination circuitry responsive to a termination disable signal.

8. The memory module of claim 7, wherein the enable circuitry further comprises a plurality of switches coupled between the termination circuitry and the lines.

9. The memory module of claim 7, wherein the termination circuitry further comprises switchable resistors configured to receive the termination disable signal.

10. The memory module of claim 7, further comprising a switch configured to provide the termination disable signal.

11. A memory module, comprising:
a memory device;
a connector;
a plurality of lines coupling the memory device and the connector;
termination circuitry coupled to at least a subset of the lines;
enable circuitry coupled to the termination circuitry and being configured to disable the termination circuitry responsive to a termination disable signal; and
a jumper configured to provide the termination disable signal.

12. The memory module of claim 7, further comprising a termination disable signal line coupled to the connector for providing the termination disable signal.

13. The memory module of claim 1, wherein the connector further comprises an edge connector.

14. A system, comprising:
a circuit board including a memory bus and an expansion socket coupled to the memory bus; and
a memory module including:
a memory device;
a connector adapted to interface with the expansion socket;
a plurality of lines coupling the memory device and the connector;
termination circuitry coupled to at least a subset of the lines; and
a termination voltage generator adapted to generate a termination voltage signal, the termination circuitry being configured to terminate the subset of the lines using the termination voltage signal.

15. The system of claim 14, wherein the termination circuitry further comprises a pull-up resistor coupled between each of the lines in the subset and the termination voltage generator.

16. The system of claim 14, wherein the termination voltage generator further comprises a voltage regulator.

17. The system of claim 14, wherein the termination voltage generator further comprises a voltage divider.

18. The system of claim 17, wherein the voltage divider further comprises:
a first resistor having a first terminal coupled to a supply voltage source and a second terminal coupled to one of the lines in the subset; and
a second resistor having a first terminal coupled to the second terminal of the first resistor and a second terminal coupled to ground, the termination voltage signal being generated at the connection of the second terminal of the first resistor and the first terminal of the second resistor.

19. A system, comprising:
a circuit board including a memory bus and an expansion socket coupled to the memory bus; and
a memory module including:
a memory device;
a connector adapted to interface with the expansion socket;
a plurality of lines coupling the memory device and the connector; and
termination circuitry coupled to at least a subset of the lines including a plurality of voltage dividers coupled to the lines in the subset, each voltage divider comprising:
a first resistor having a first terminal coupled to a supply voltage source and a second terminal coupled to one of the lines in the subset; and
a second resistor having a first terminal coupled to the second terminal of the first resistor and a second terminal coupled to ground, the termination voltage signal being generated at the connection of the second terminal of the first resistor and the first terminal of the second resistor.

20. The system of claim 14, wherein the memory module further comprises enable circuitry coupled to the termination circuitry and being configured to disable the termination circuitry responsive to a termination disable signal.

21. The system of claim 20, wherein the enable circuitry further comprises a plurality of switches coupled between the termination circuitry and the lines.

22. A system, comprising:
a circuit board including a memory bus and an expansion socket coupled to the memory bus; and
a memory module including:
a memory device;
a connector adapted to interface with the expansion socket;
a plurality of lines coupling the memory device and the connector;
termination circuitry coupled to at least a subset of the lines, comprising switchable resistors configure to receive a termination disable signal;
enable circuitry coupled to the termination circuitry and being configured to disable the termination circuitry responsive to the termination disable signal.

23. The system of claim 20, wherein the memory module further comprises a switch configured to provide the termination disable signal.

24. A system, comprising:
a circuit board including a memory bus and an expansion socket coupled to the memory bus; and
memory module including:
a memory device;
a connector adapted to interface with the expansion socket;
a plurality of lines coupling the memory device and the connector;
termination circuitry coupled to at least a subset of the lines;
enable circuitry coupled to the termination circuitry and being configured to disable the termination circuitry responsive to a termination disable signal; and
a jumper configured to provide the termination disable signal.

25. The system of claim 20, wherein the memory module further comprises a termination disable signal line coupled to the connector for providing the termination disable signal.

26. The system of claim 14, wherein the connector further comprises an edge connector.

27. A memory module, comprising:
a memory device;
a connector;
a plurality of lines coupling the memory device and the connector;
a termination voltage line;
a plurality of pull-up resistors coupled between selected lines of the plurality of lines and the termination voltage line; and a termination voltage generator coupled to the termination voltage line.

28. The memory module of claim 27, wherein the termination voltage generator further comprises a voltage regulator.

29. The memory module of claim 27, wherein the termination voltage generator further comprises a voltage divider.

30. The memory module of claim 29, wherein the voltage divider further comprises:

a first resistor having a first terminal coupled to a supply voltage source and a second terminal coupled to the termination voltage line; and a second resistor having a first terminal coupled to the second terminal of the first resistor and a second terminal coupled to ground.

31. A memory module, comprising:

a memory device;

a connector;

a plurality of lines coupling the memory device and the connector;

a termination voltage line;

a plurality of pull-up resistors coupled between selected lines of the plurality of lines and the termination voltage line; and switches coupled between the pull-up resistors and the termination voltage line, the switches being configured to disable the pull-up resistors responsive to a termination disable signal.

32. The memory module of claim 27, wherein the connector further comprises an edge connector.

33. A method for fabricating a memory module, comprising:

providing a circuit board having a connector;

mounting a memory device on the circuit board;

coupling the memory devices to the connector using a plurality of lines;

coupling termination circuitry to at least a subset of the lines;

providing a termination voltage generator on the circuit board to generate a termination voltage signal; and coupling the termination voltage generator to the termination circuitry.

34. The method of claim 33, wherein providing the termination circuitry further comprises coupling a pull-up resistor between each of the lines in the subset and the termination voltage generator.

35. The method of claim 33, wherein providing the termination voltage generator further comprises providing a voltage regulator.

36. The method of claim 33, wherein providing the termination voltage generator further comprises providing a voltage divider.

37. The method of claim 36, wherein providing the voltage divider further comprises:

coupling a first terminal of a first resistor to a supply voltage source;

coupling a second terminal of the first resistor to one of the lines in the subset; and coupling a first terminal of a second resistor to the second terminal of the first resistor; and coupling a second terminal of the second resistor to ground, the termination voltage signal being generated at the connection of the second terminal of the first resistor and the first terminal of the second resistor.

38. A method for fabricating a memory module, comprising:

providing a circuit board having a connector;

mounting a memory device on the circuit board;

coupling the memory devices to the connector using a plurality of lines;

coupling termination circuitry to at least a subset of the lines, wherein coupling the termination circuitry further comprises providing a plurality of voltage dividers coupled to the lines in the subset, each voltage divider comprising a first resistor having a first terminal coupled to a supply voltage source and a second terminal coupled to one of the lines in the subset and a second resistor having a first terminal coupled to the second terminal of the first resistor and a second terminal coupled to ground, a termination voltage being generated at the connection of the second terminal of the first resistor and the first terminal of the second resistor.

39. The method of claim 33, further comprising coupling enable circuitry to the termination circuitry for disabling the termination circuitry responsive to a termination disable signal.

40. The method of claim 39, wherein providing the enable circuitry further comprises coupling a plurality of switches between the termination circuitry and the lines.

41. A method for fabricating a memory module, comprising:

providing a circuit board having a connector;

mounting a memory device on the circuit board;

coupling the memory devices to the connector using a plurality of lines;

coupling termination circuitry to at least a subset of the lines, the termination circuitry comprising switchable resistors configured to receive a termination disable signal; and coupling enable circuitry to the termination circuitry for disabling the termination circuitry responsive to a termination disable signal.

42. The method of claim 39, further comprising providing a switch on the circuit board configured to provide the termination disable signal.

43. A method for fabricating a memory module, comprising:

providing a circuit board having a connector;

mounting a memory device on the circuit board;

coupling the memory devices to the connector using a plurality of lines;

coupling termination circuitry to at least a subset of the lines;

coupling enable circuitry to the termination circuitry for disabling the termination circuitry responsive to a termination disable signal; and providing a jumper on the circuit board configured to provide the termination disable signal.

44. The method of claim 39, further comprising coupling a termination disable signal line to the connector for providing the termination disable signal.

* * * * *